July 12, 1966 N. SCHINK 3,260,626

METHOD OF PRODUCING AN OXIDE COATING ON CRYSTALLINE SEMICONDUCTOR BODIES

Filed May 10, 1963

3,260,626

METHOD OF PRODUCING AN OXIDE COATING ON CRYSTALLINE SEMICONDUCTOR BODIES

Norbert Schink, Erlangen, Germany, assignor to Siemens-Schuckertwerke Aktiengesellschaft, Berlin-Siemensstadt, Germany, a corporation of Germany Filed May 10, 1963, Ser. No. 280,497
Claims priority, application Germany, Nov. 18, 1961, S 76,751; May 10, 1962, S 79,384, S 79,385
20 Claims. (Cl. 148—186)

This invention is a continuation-in-part of my application Serial No. 237,552, filed November 14, 1962, now abandoned, and relates to a method of producing an oxide coating on a crystalline, preferably monocrystalline body of semiconductor material.

As a rule, electronic semiconductor devices such as rectifiers, transistors, photodiodes, four-layer junction devices of the p-n-p-n type and the like components, comprise a substantially monocrystalline body of semiconductor material with which one or more electrodes are joined by diffusion or alloying, the semiconductor material consisting, for example, of elements from the fourth group of the periodic system such as silicon or germanium, or of intermetallic semiconductor compounds of respective elements from the third and fifth groups, or from the second and sixth groups of the periodic system.

It is known to provide the surface of such semiconductor bodies with an oxide coating. Upon completion of the semiconductor device the oxide coating may serve to prevent foreign substances from entering into the semiconductor material. Such oxide coatings may also be used as a mask when producing semiconductor devices by diffusion methods. One way of doing this is to provide the surface of the semiconductor, for example germanium or silicon, with the oxide coating, then photo-chemically removing a portion of the coating, and thereafter subjecting the body to diffusion, for example, of phosphorus or aluminum at elevated temperature. The particular doping substance then penetrates into the semiconductor crystal only at the exposed localities, whereas the oxide coating on the other surface areas acts as an impenetrable mask.

Conversely, oxide coatings with included doping substances can be deposited or produced on semiconductor bodies, and thereafter the dopant can be caused to diffuse from the coating into the semiconductor material by subjecting the coated body to heat treatment.

Oxide coatings may also be used for securing a uniform and crystallographically undisturbed surface of semiconductor bodies. For this purpose the body is first coated with oxide and the coating is thereafter removed chemically, for example by means of hydrofluoric acid. The crystalline surface layers thus laid bare then substantially correspond to the lattice planes of the crystal.

It is known, for various purposes of the kind mentioned above, to provide a monocrystalline body of semiconductor material with an oxide coating by subjecting the body to heat treatment in air or in another oxygen-containing atmosphere. The heating of the semiconductor body for such treatment must be up to temperatures of 600° C. in order to obtain a dense and sufficiently stable oxide coating. It is also known to perform such oxidation at higher temperatures under application of hydrogen. A common shortcoming of these methods are the high temperatures to be employed because they make it impossible, for example, to perform the oxidation with otherwise completed alloyed semiconductor devices since the bonded electrodes would melt at the oxidizing temperatures. Furthermore such high temperatures may cause undesirable diffusion of introduced dopant impurities, as well as of any detrimental impurities as may be present. The heat treatment at relatively high temperatures as required by known oxidizing methods also tends to appreciably impair the lifetime values of the minority charge carriers in the semiconductor material.

It is an object of my invention to minimize or virtually eliminate all of the above-mentioned disadvantages encountered with the semiconductor oxidizing methods heretofore available.

Another object of my invention is to modify the doping of the semiconductor product so that it either contains layers of doped material or is doped entirely throughout. The doping may be of different type or concentration. Other objects will become obvious from the further description of my invention.

To this end, and in accordance with a feature of my invention, an oxide coating on a crystalline semiconductor body, preferably a monocrystalline body, of silicon is produced by heating the body at only moderately elevated temperature in an atmosphere consisting largely of water vapor (steam). Accordingly to a more specific feature of my invention, I admix to the steam a substance that gives off hydrogen ions and/or alkali metal ions and vaporizes at least partially at the elevated temperature being employed. It is preferable to perform the method at a temperature of at least about 250° C., particularly at about 350° C. for a minimum period of approximately 30 minutes. However, the temperature should remain below the melting temperature of any alloy bond present in or at the semiconductor body being treated.

Another modification of the invention is by substituting hydrogen peroxide in high concentration, e.g., on the order of 30%, for the water, used in the first-mentioned modification. This second modification is carried out in exactly the same manner as the method disclosed in the modification first described, except that hydrogen peroxide is used instead of water. I have found that, while using the same temperature, quantities and time periods, the hydrogen peroxide modification results in the production of oxide film layers which are at least twice as thick as those obtained in accordance with the water modification. This is apparently due to the fact that, when using hydrogen peroxide, the oxygen is available in a particularly highly reactive form. The oxide film layers obtained are wipe-resistant and chlorine-resistant. This can be explained on the theory that a substance that gives off hydrogen or alkali ions or both is capable of causing some "softening" of the crystal lattice in the semiconductor material. The difficulty of producing an oxide coating of sufficient density and thickness on a semiconductor body, for example silicon or germanium, is otherwise essentially due to the fact that after production of the first oxide layer, this layer prevents the penetration of oxygen and thereby an oxidation of the underlying strata. In contrast thereto, it seems that a substrance which gives off hydrogen and/or alkali ions possesses the capability of transporting hydrogen through the first occurring oxide layer. Such a substance, therefore, seems to act as a quasi-catalyst in the semiconductor oxidizing method of the invention. Apparently, the property of such substance to dissolve oxide coatings at least superficially or to become dissolved in such coatings, plays an essential part in the just-mentioned capability of oxygen transportation.

The outstanding advantage of the invention resides in the applicability of lower temperatures. This makes it possible, for example, to apply protective oxide coatings to the surface of electronic semiconductor devices that comprise alloy-bonded electrodes consisting of a gold-semiconductor eutectic, even after the device is otherwise completed. Gold-germanium eutectic has a melting temperatures of 360° C. Gold-silicon eutectic melts at 370° C. The method according to the invention can readily be performed within economically short periods of time at temperatures below these melting points.

The doping substance is equally incorporated into the oxide layer produced and diffuses therefrom into the adjacent semiconductor layer during a subsequent thermal treatment, which is carried out at a temperature above 1000° C. for a period of several hours. It is thereby possible to modify the doping of the semiconductor body either layer-wise or entirely, either in type or concentration. In the diffusion operation, merely the doping substance incorporated in the oxide diffuses into the semiconductor body, whereas the oxide acts as a masking and covering substance with respect to a foreign substance which might enter the body.

The drawings depict apparatus for carrying out the present invention. In the drawings:

FIG. 2 shows a second apparatus for carrying out the invention, of which

Figure 1:
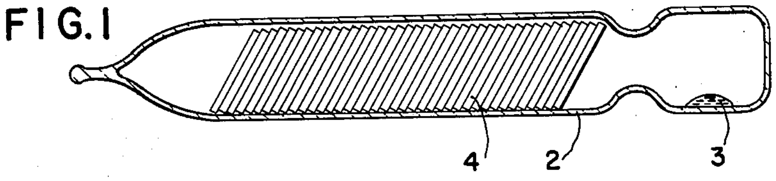
FIG. 1 shows one apparatus for carrying out the invention.

The drawings will be further described with reference to the description of the process for carrying out the invention.

*Example I*

Placed into an ampule 2, consisting of glass or quartz for example, is a slight quantity of water at 3 with a slight quantity of a substance that evolves hydrogen or alkali metal ions or both when moderately heated. Suitable and used in the example here described are 100 mg. water and 20 mg. salt (NaCl). Also placed into the ampule, but separated from the salt-containing water at 3 by a constriction of the ampule wall, are 40 semiconductor discs 4 of circular shape consisting of silicon and having a diameter of 12 mm. and a thickness between 0.1 and 0.40 mm. Thereafter the ampule is fused off and thus sealed. In the practical performance of the method it was found unnecessary to remove the air contained in the ampule. The sealed ampule is placed into a steel tube corresponding to the perimeter of the ampule. In that tube the ampule is heated to about 320° C. for a period of 16 hours. During the heat treatment, the pressure within the ampule increases. The steel tube serves, among other things, for protection from gas splinters in the event of an explosion of the ampule.

After the heat treatment, the semiconductor bodies are coated with an oxide layer of approximately 1000 Angstrom thickness. Such an oxide coating is electrically insulating for voltages up to 800 v.

*Example II*

Placed into ampule 2 is a series of disc- or wafer-shaped semiconductor bodies 4, dimensioned as in the previous example. A small quantity (3), for instance 100 mg., of hydrogen peroxide and 20 mg. sodium chloride is placed a certain predetermined distance from said bodies 4, for example in a compartment separated from the ampule proper by a bottleneck. Thereafter the ampule is fused off and thus sealed. The ampule was heated in a furnace to a temperature above 250° C., and more particularly to a temperature of 350° C. and maintained thereat for a period of at least 30 minutes. It is, for example, possible to effect a thermal treatment at 300° C. for a duration of 16 hours. After such a thermal treatment the semiconductor bodies comprise an oxide film having a thickness of several 1000 Angstrom.

Figure 2:
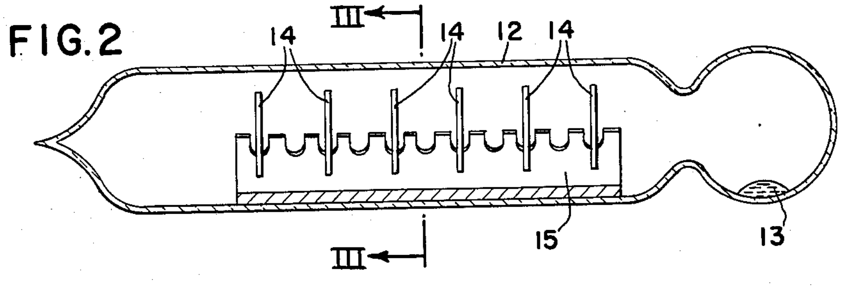
Figure 3:
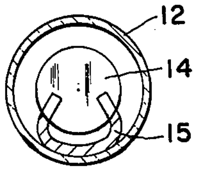
FIG. 3 is a cross section taken along the line III—III of FIG. 2.

The apparatus in FIG. 2 is similar to that shown in FIG. 1 with the numerals 12, 13 and 14 corresponding respectively to the numerals 2, 3 and 4 of FIG. 1. The number 15 constitutes a holder in which a semiconductor disc may be placed in the same manner in which records are placed in a record holder. The holder may consist of a hollow cylinder longitudinally cut in half, and having transversely extending slots for holding the semiconductor disc. These discs 14, which are comprised for example of silicon or germanium, are inserted into the holder 15 in the same manner in which records are inserted into a record holder. When it is desired to obtain a doping effect, the ampule is destroyed, the semiconductor disc removed therefrom, and the discs are then subjected to thermal treatment at a temperature above 1000° C. for a period of several hours. The temperature and duration of this thermal treatment depend upon the desired thickness of the doped layer as well as the doping substance being used. It is preferable when carrying out the subsequent thermal treatment, to use the device shown in FIG. 2 since the holder and discs may be placed into the furnace for the subsequent heat treatment with less danger of contamination than would be present if the discs were removed from a device such as that shown in FIG. 1.

*Example III*

A holder 15, consisting of an aluminum sheet and having stacked therein approximately 10 silicon discs or a diameter of about 12 mm. and a thickness between 0.1 and 0.4 mm. with a resistivity of 200 ohm-cm. is introduced into a glass ampule 12. The weight of the aluminum sheet is about three grams. About 100 milligrams of 35% HCl is introduced into the separate compartment of the ampule at 13. When using hydrochloric acid it is unnecessary to add additional water since water is present in the acid solution. The ampule is thereafter fused off and thus sealed. It is subjected to a heat treatment of about 300° C. for a period of 16 hours, whereby an oxide layer having a thickness of several thousand A. forms. Into this oxide layer, aluminum is incorporated. Subsequent to the formation of the oxide layer, the semiconductor discs are treated under an atmosphere of nitrogen for about 16 hours at a temperature of about 1280° C. Although nitrogen per se brings about an n-type doping effect, it does not penetrate into the semiconductor material because of the presence of the oxide layer. After this diffusion treatment, the silicon comprises an aluminum doping in a concentration of $3\times10^{16}$ to $2\times10^{17}$ cm.$^{-3}$ to a depth of 70 to 130 microns. In cases where the silicon previously had an n-type conductivity, a p-n junction forms at the indicated depth and the semiconductor body may be further fabricated to form the desired semiconductor elements such as transistors and the like. The lifetime of the minority carriers in the semiconductor body subjected to treatment of this type is $\tau=3$ microseconds.

*Example IV*

Semiconductor discs, as in Example III, are inserted into a holder 15. In this example, the holder consists of glass. Approximately 50 milligrams of boric acid ($H_3BO_3$) and 100 milligrams of water were introduced into a separate compartment of the ampule at 13. Thereafter, the ampule with its contents were subjected to a 16-hour heat treatment of 300° C. This produced a boron-doped oxide layer. The boron was diffused from this boron-doped oxide layer into the semiconductor material by a diffusion operation as described in the preceding example. The boron-doped layer semiconductor has a thickness of about 60 microns. The concentration of the boron in the doped layer is approxiamtely $3\times10^{18}$ to $1\times10^{19}$ cm.$^{-3}$.

*Example V*

Semiconductor discs or wafers are inserted into an aluminum holder. A mixture consisting of hydrochloric acid, boric acid and water is introduced into the separate communicating compartment of the ampule. The thermal treatment is effected in accordance with the procedure described in connection with Examples III and IV.

*Example VI*

Semiconductor discs 14 are placed into a glass holder 13, and a mixture consisting of approximately 100 milligrams orthophosphoric acid ($H_3PO_4$) and about 100 milligrams water is introduced into a separate communicating compartment of the ampule. This is followed by a thermal treatment at 300° C. for 16 hours. In the course of a subsequent 16-hour thermal treatment at 1260° C. under a nitrogen current atmosphere, an n-type semiconductor zone having a thickness of approximately 55 microns is obtained due to phosphorus diffusion. The phosphorus concentration in the thus doped semiconductor material is approximately $2\times10^{18}$ to $1\times10^{19}$ cm.$^{-3}$.

*Example VII*

Semiconductor wafers are placed into a holder made of glass or aluminum, and are introduced into the ampule. A mass consisting of aluminum chloride with water of crystallization ($AlCl_3\cdot6H_2O$) and water ($H_2O$) is introduced into the separate communicating compartment of the ampule at 13. Hydrochloric acid forms by hydrolysis, and hydrogen ions are set free. The treatment is effected in the same manner as in Examples III to VI.

*Example VIII*

When using sulphuric acid at 13, sulphur from the oxide layers produced in the first stage of treatment, diffuses to a much greater depth or at a much greater rate than other substances. This permits carrying out a doping operation by diffusion wherein one of two respectively different substances diffuses into a body at a rate more quickly than the other. Thus, for instance, it is possible to place semiconductor discs into a glass holder 15 and insert the holder with wafers into an ampule containing 50 milligrams of sulphuric acid, 50 milligrams of phosphoric acid and 100 milligrams of water in a separate compartment of the ampule at 13. The oxide layers produced in the first thermal treatment contain both sulphur and phosphorus. In the subsequent thermal treatment, the sulphur penetrates more deeply than the phosphorus; consequently a phosphorus-doped low-ohmic $n^{++}$-type layer is obtained, and a less intensely doped $n^{+}$-type layer which consequently has a higher ohmic value located more centrally within the semiconductor body.

It is also possible to obtain in a similar manner a simultaneous diffusion of boron and sulphur whereby a $p^{++}$-type layer (boron) is obtained on the outside, and an $n^{+}$-type layer (sulphur) is obtained on the inside. For the purpose of producing such oxide films it is desirable to use at 13 a mixture consisting of 50 milligrams of sulphur acid, 50 milligrams of boric acid and 100 milligrams of water.

It is obvious to those skilled in the art that it is also possible to effect the first thermal treatment in a continuous process wherein a furnace is continuously charged with semiconductor discs and with active gases. It is, however, advantageous to use a closed ampule, particularly in those cases where only a small quantity of semiconductor discs are being produced, as well as in those cases where experiments are being carried out. Of course, it is recognized that the particular diameter of the semiconductor disc may be varied and that the quantity of substances used for producing an oxide layer should be varied accordingly. It is further obvious that in the preceding Examples III through VIII, hydrogen peroxide could have been used instead of water. This would result, as stated above, in an oxide layer twice as thick as that produced by using water, all other conditions remaining the same.

Examples of hydrogen-ion and/or alkali-ion as evolving substances which are also well suitable for the modifications above are as follows: sodium acetate, orthophosphoric acid, sulphuric acid, disodiumhydrogenphosphate, sodium chloride, sodium iodide, and sodium arsenite.

When treating semiconductor substances, for example silicon or germanium, with the above-mentioned ionizing substances in conjunction with steam, the resulting oxide coatings have a relatively large thickness and high stability. For example, such coatings produced on silicon were not penetrated by chlorine at 900° C. so that the silicon material beneath the coating was not attacked by the chlorine. The oxide coatings were also found relatively resistant to frictional wear and could not be wiped off with filter paper. This is in favorable contrast to oxide coatings produced at low temperatures by known other methods but which, according to experience, can readily be scraped off with the aid of filter paper.

I claim:

1. The method of producing an oxide coating on a monocrystalline semiconductor body, which comprises heating the semiconductor body, to a temperature at least of 250° C. but below 500° C., in an atmosphere selected from the group consisting of steam and hydrogen peroxide and containing a substance which at said temperature gives off ions selected from the group consisting of hydrogen and alkali ions and to vaporize at least partially.

2. The method of producing an oxide coating on a monocrystalline silicon body, which comprises heating the silicon body to a temperature between 250° C. and 500° C. for at least 30 minutes in an atmosphere selected from the group consisting of steam and hydrogen peroxide and containing a substance which at said temperature gives off ions selected from the group consisting of hydrogen and alkali ions and to vaporize at least partially.

3. The method of producing an oxide coating on a monocrystalline semiconductor body, which comprises heating the semiconductor body, to a temperature at least of 250° C. but below 500° C., in an atmosphere of superatmospheric steam containing a substance which at said temperature gives off ions selected from the group consisting of hydrogen and alkali ions and to vaporize at least partially.

4. The method of producing an oxide coating on a monocrystalline semiconductor body, having an alloy-bonded electrode, which comprises heating the semiconductor body, to a temperature above 250° C. but below the melting point of the alloy bond, in an atmosphere of hydrogen peroxide containing a substance which at said temperature gives off ions selected from the group consisting of hydrogen ions and alkali ions and to vaporize at least partially.

5. The method of producing an oxide coating on a monocrystalline semiconductor body of material selected from the group consisting of silicon and germanium, which comprises heating the semiconductor body to a temperature of approximately 350° C. for at least 30 minutes in an atmosphere selected from the group consisting of steam and hydrogen peroxide and containing a substance which at said temperature splits off ions selected from the group consisting of hydrogen ions and alkali ions and to vaporize at least partially.

6. The method of producing an oxide coating on a monocrystalline semiconductor body, which comprises heating the semiconductor body, to a temperature at least of 250° C. but below 500° C., in an atmosphere of steam containing a sodium salt which vaporizes at said temperature.

7. The method of producing an oxide coating on a monocrystalline semiconductor body, which comprises heating the semiconductor body, to a temperature at least of 250° C. but below 500° C., in an atmosphere of hydrogen peroxide containing a sodium salt which vaporizes at said temperature.

8. The method of producing an oxide coating on a monocrystalline semiconductor body, which comprises heating the semiconductor body, to a temperature at least of 250° C. but below 500° C., in an atmosphere of steam containing sodium chloride.

9. The method of producing an oxide coating on a monocrystalline semiconductor body, which comprises heating the semiconductor body, to a temperature at least of 250° C. but below 500° C., in an atmosphere of hydrogen peroxide containing sodium chloride.

10. The method of producing an oxide coating on a monocrystalline semiconductor body, which comprises heating the semiconductor body, to a temperature at least of 250° C. but below 500° C., in an atmosphere of steam containing sodium acetate.

11. The method of producing an oxide coating on a monocrystalline semiconductor body, which comprises heating the semiconductor body, to a temperature at least of 250° C. but below 500° C., in an atmosphere of hydrogen peroxide containing sodium acetate.

12. The method of producing an oxide coating on a monocrystalline semiconductor body, which comprises heating the semiconductor body, to a temperature at least of 250° C. but below 500° C., in an atmosphere of steam containing sodium arsenite.

13. The method of producing an oxide coating on a monocrystalline semiconductor body, which comprises heating the semiconductor body, to a temperature at least of 250° C. but below 500° C., in an atmosphere of hydrogen peroxide containing sodium arsenite.

14. The method of producing an oxide coating on a monocrystalline semiconductor body, which comprises heating the semiconductor body, to a temperature at least of 250° C. but below 500° C., in an atmosphere of steam containing phosphoric acid.

15. The method of producing an oxide coating on a monocrystalline semiconductor body, which comprises heating the semiconductor body, to a temperature at least of 250° C. but below 500° C., in an atmosphere of hydrogen peroxide containing phosphoric acid.

16. The method of producing an oxide coating and doping a monocrystalline semiconductor body, which comprises heating the semiconductor body to a temperature at least of 250° C. but below 500° C., in an atmosphere selected from the group consisting of steam and hydrogen peroxide and containing a substance which at said temperature gives off ions selected from the group consisting of hydrogen and alkali ions and to vaporize at least partially, together with a doping substance capable of at least partially vaporizing at said temperature, and thereafter heating the semiconductor so produced at a temperature of above 1000° C. for several hours.

17. The process of claim 16, wherein aluminum chloride is the doping substance.

18. The process of claim 16, wherein boric acid serves the purpose of both producing hydrogen ions and as the doping agent.

19. The process of claim 16, wherein sulphur acid serves the purpose of both producing hydrogen ions and as the doping agent.

20. The process of claim 16, wherein the substance for producing the ions and the substance containing the doping material is one and the same.

References Cited by the Examiner

UNITED STATES PATENTS

| | | | |
|---|---|---|---|
| 2,802,760 | 8/1957 | Derick | 148—189 |
| 2,817,609 | 12/1957 | Waters | 148—185 |
| 2,875,384 | 2/1959 | Wallmark | 117—200 |
| 3,108,915 | 10/1963 | Ligenza | 148—187 |
| 3,114,663 | 12/1963 | Klerer | 117—201 |

FOREIGN PATENTS

| | | |
|---|---|---|
| 632,442 | 11/1949 | Great Britain. |

OTHER REFERENCES

Mellor: Comprehensive Treatise on Inorganic and Theoretical Chemistry, vol. VI, Longmans, Green & Company, N.Y. 1925, p. 161.

HYLAND BIZOT, *Primary Examiner.*

DAVID L. RECK, *Examiner.*

H. W. CUMMINGS, *Assistant Examiner.*